United States Patent [19]

Doland

[11] 4,240,156
[45] Dec. 16, 1980

[54] CONCATENATED ERROR CORRECTING SYSTEM

[76] Inventor: George D. Doland, 1602 Redway La., Houston, Tex.

[21] Appl. No.: 25,079

[22] Filed: Mar. 29, 1979

[51] Int. Cl.³ .............................................. G06F 11/10
[52] U.S. Cl. ......................................... 371/43; 371/37
[58] Field of Search ......................... 371/43, 44, 45, 37

[56] References Cited

U.S. PATENT DOCUMENTS

| 3,697,950 | 10/1972 | Low et al. | 371/43 |
| 3,789,360 | 1/1974 | Clark, Jr. et al. | 371/43 |
| 3,988,677 | 10/1976 | Fletcher et al. | 371/37 |
| 4,038,636 | 7/1977 | Doland | 371/37 |
| 4,105,238 | 3/1977 | Davis | 371/43 |

OTHER PUBLICATIONS

Peterson and Weldon, Error Correcting Codes, The MIT Press, 1972, pp. 139-143 and 412-426.

Primary Examiner—Charles E. Atkinson

[57] ABSTRACT

The error correcting system comprising this invention consists of a Modified Viterbi Decoder concatenated with an Improved Multiple Decoding System. The Modified Viterbi Decoder provides a soft decision quality signal output used by the Improved Multiple Decoder so that the error correcting capabilities of each type decoder are additive yielding net coding gains not heretofore achievable.

8 Claims, 7 Drawing Figures

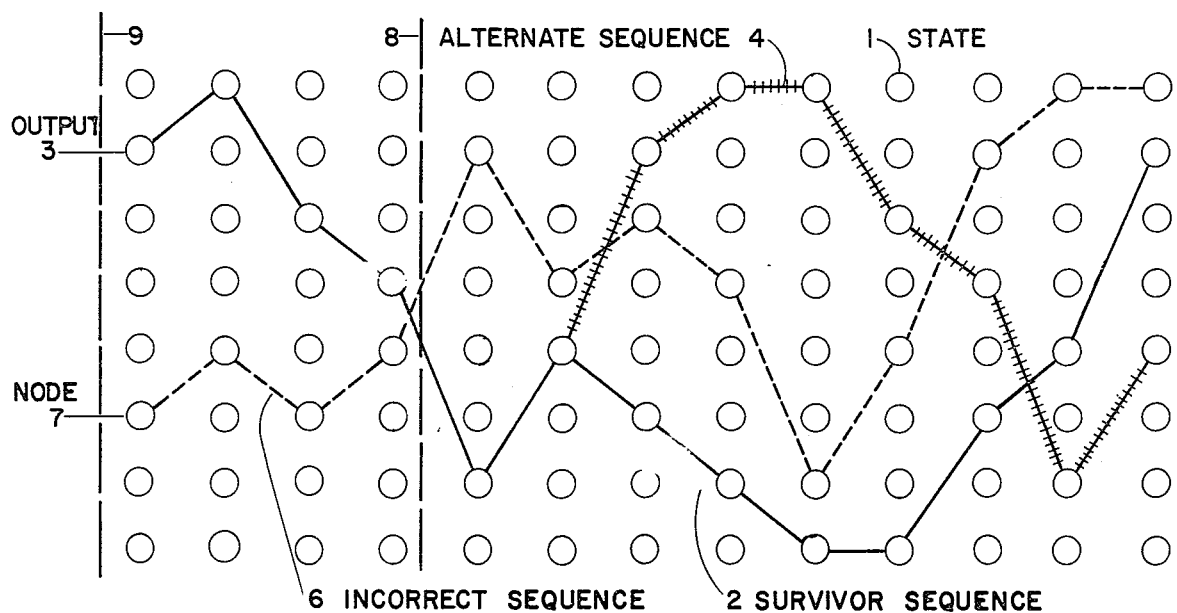
FIGURE 1, TRELLIS DIAGRAM
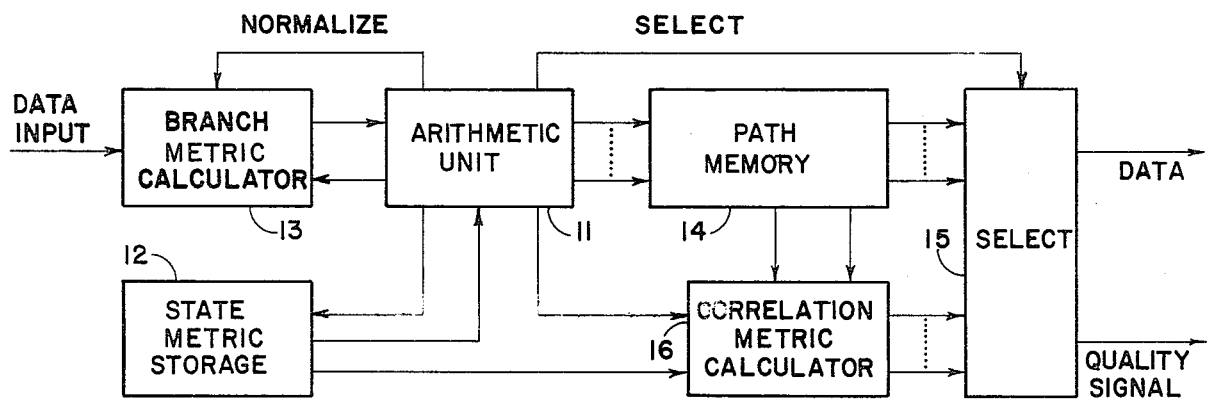
FIGURE 2, MODIFIED VITERBI DECODER
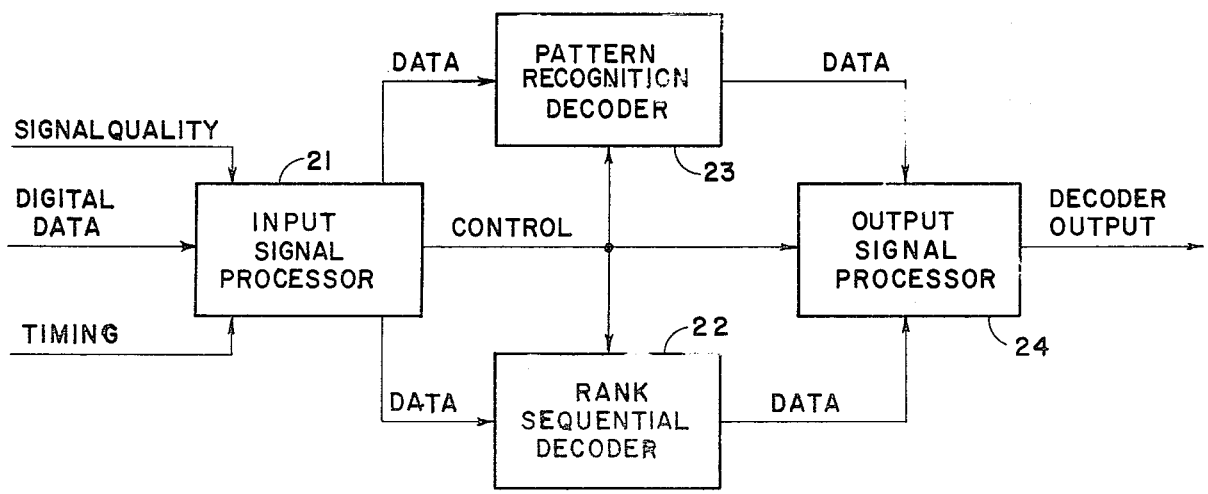
FIGURE 3, DECODER BLOCK DIAGRAM

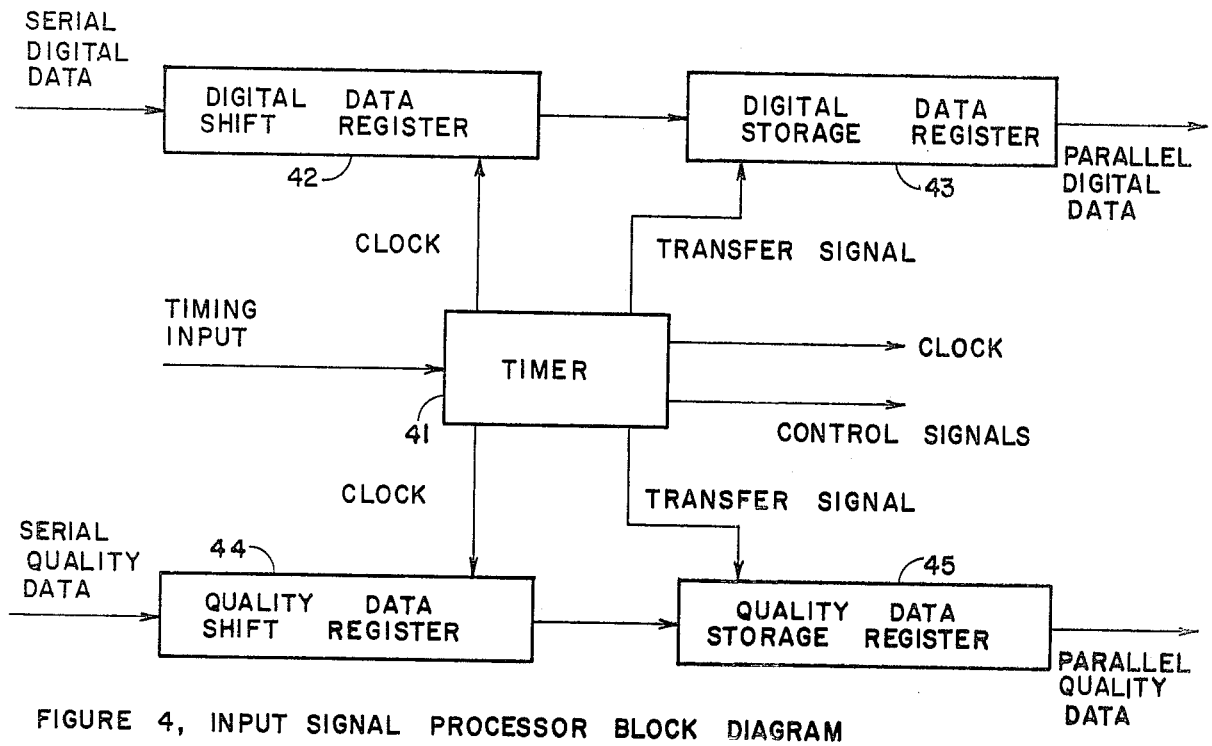
FIGURE 4, INPUT SIGNAL PROCESSOR BLOCK DIAGRAM
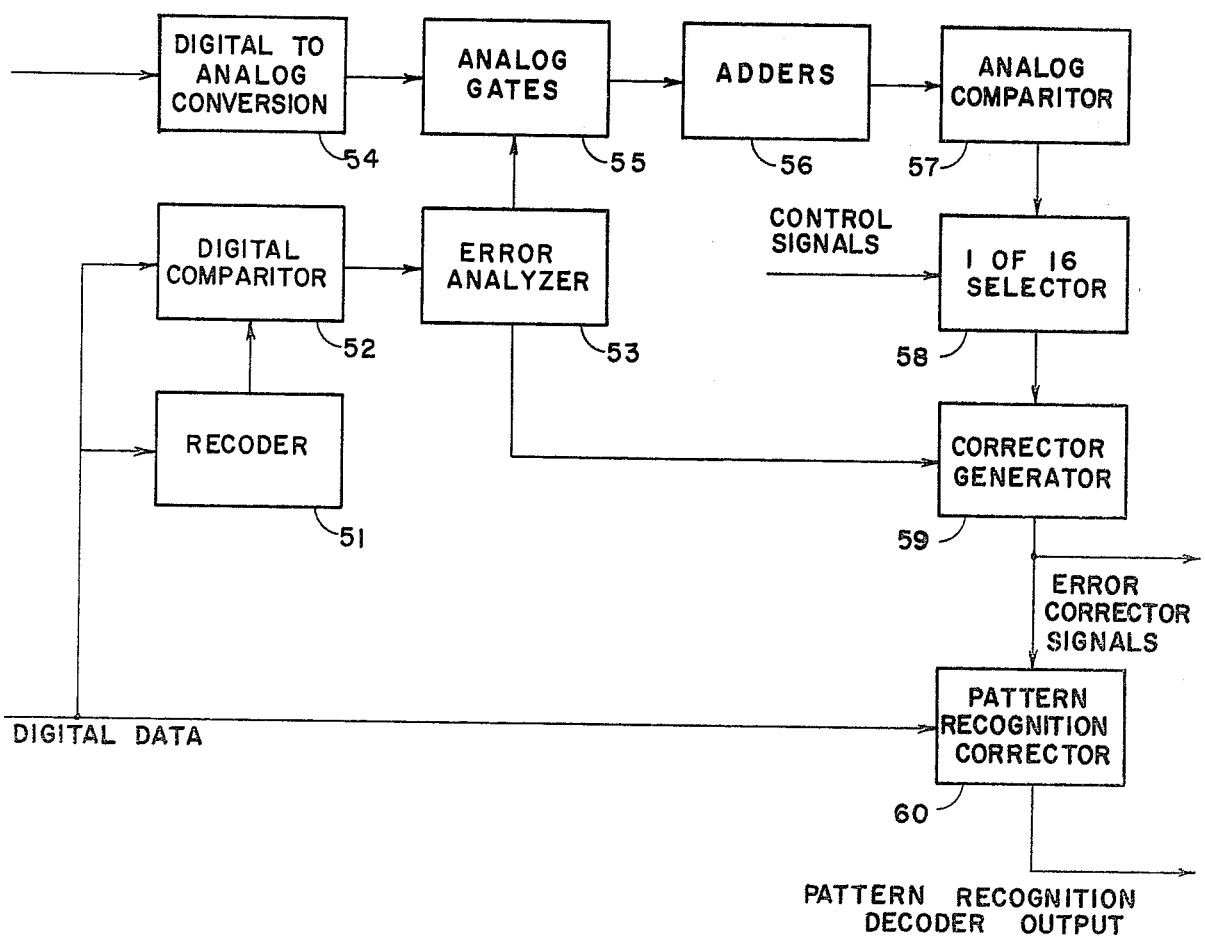
FIGURE 5, PATTERN RECOGNITION DECODER BLOCK DIAGRAM

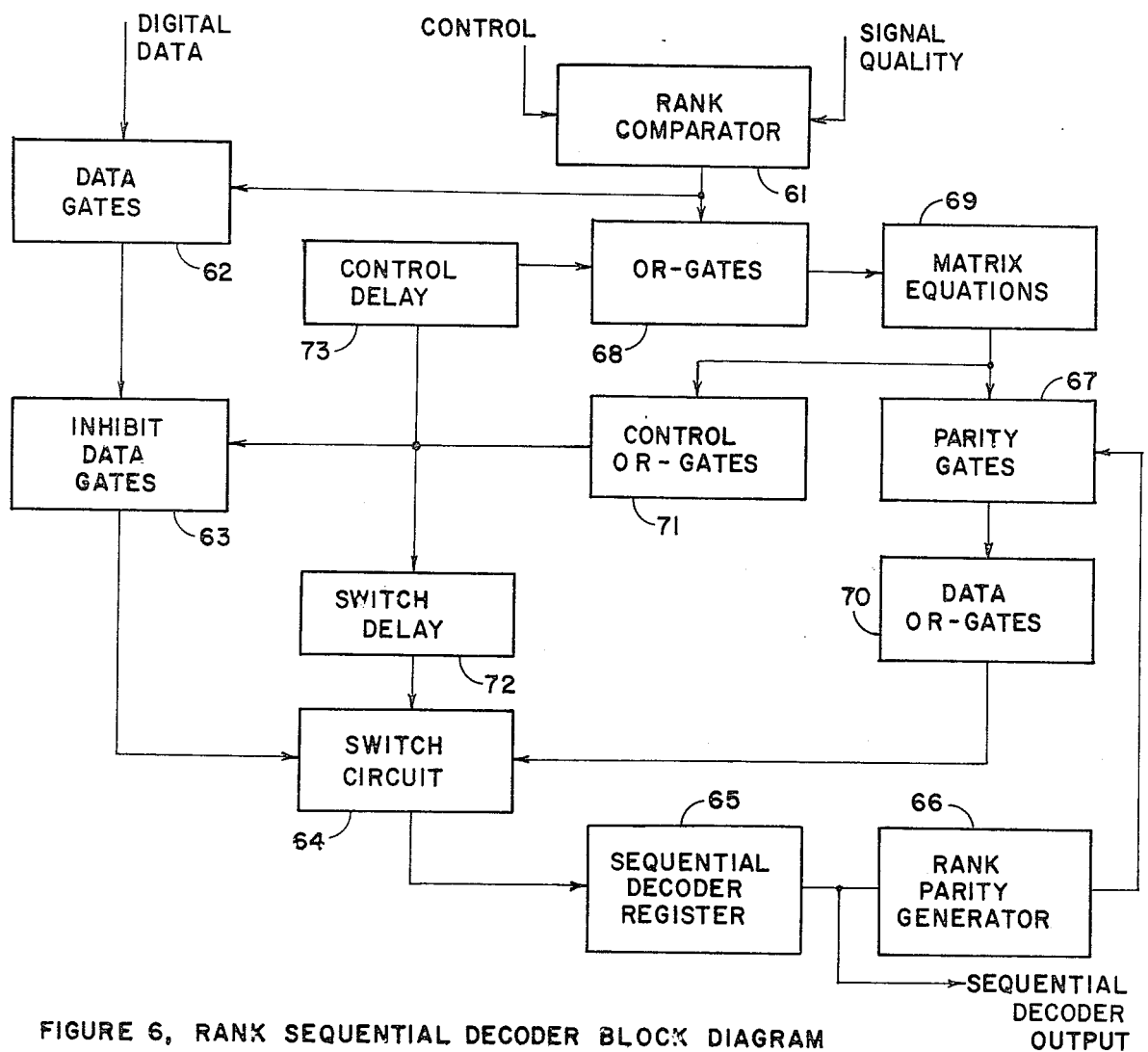
FIGURE 6, RANK SEQUENTIAL DECODER BLOCK DIAGRAM
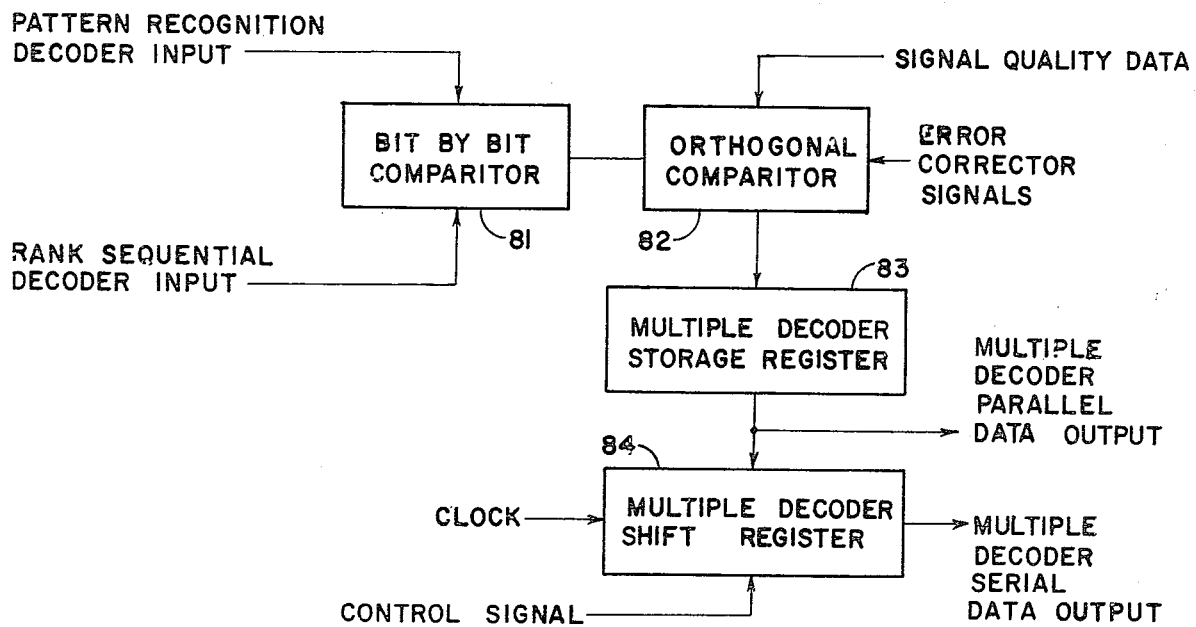
FIGURE 7, OUTPUT SIGNAL PROCESSOR BLOCK DIAGRAM

CONCATENATED ERROR CORRECTING SYSTEM

BACKGROUND OF THE INVENTION

Many years ago Dr. Shannon proved that it was possible to encode digital data and effect improved data transmission. This theory was known as the channel capacity theorem. His theory only proved there existed coding techniques but did not consider the means to achieve a net coding gain. One class of codes were called block codes and a separate distinctly different class was referred to as convolutional codes.

It became apparent that convolutional codes were in general superior to block codes because soft decision techniques were used in the convolutional decoders. The technique which achieved general acceptance is the Viterbi decoder well described in texts and other publications. Most convolutional decoders are of this type and provide excellent performance. This type of decoding is described under U.S. Pat. No. 3,789,360 for Convolutional Decoder.

The technique of decoding short block codes was significantly advanced with the development of a Multiple Decoding System, U.S. Pat. No. 4,038,636 by George D. Doland. The performance of the Multiple Decoding System is also excellent but is not particularly suited to data transmitted consisting of 8 bit data words or data in bytes of 8 bits.

In order to achieve higher coding gains which are theoretically possible concatenated systems are now being considered. The Viterbi Decoder as presently implemented does not provide a quality signal output. In current concatenated systems, a hard decision decoder is concatenated with the Viterbi Decoder. This invention consists of two soft decision decoders concatenated and was the result of improvements in both the Viterbi Decoder and the Multiple Decoding System referenced to achieve a concatenated system yielding very substantial improvement in performance not heretofore achievable.

SUMMARY

Any convolutional encoder can produce only a specified number of sequences depending upon the length of the shift register (known as the constraint length) used in the encoder. Reference to the literature describing the operation of the Viterbi Decoder, it will be found that the state-to-state transistions are examined in the decoder and scores which are produced are summed to determine the most likely sequence. The most likely sequence is determined by the best correlation between the received signal and the possible sequences which can be produced by the encoder. This portion of the Viterbi Decoder is identical in this new concatenated system. However, it can be shown that a similar type of summation process can be used for the last bits in the sequences stored in the decoder to determine a measure of the correlation of the decoder output information bit with the received signal. This measure is similar to the quality signal output of a soft decision bit synchronizer.

In order to achieve a greater net improvement in the Multiple Decoding System, the number of information bits in the coded data word has been increased from 11 to 16 and the number of code bit increased from 5 to 8 compared to that used in the original Multiple Decoding System described in the referenced patent. Further, there have been improvements in implementation resulting from the availability of new integrated circuit products.

Finally, these two improved decoders have been optimized so that the information may first be coded using a word encoder and then convolutionally encoded prior to transmission. After reception, a soft decision bit synchronizer processes the signal for the input to the Modified Viterbi Decoder. This decoder then provides coded data and a quality signal to the Improved Multiple Decoder. The output is error corrected decoded digital data.

While the error correcting properties of the concantented system described above is the best technique that is known, there is always the possibility of improvements in either the convolutional decoder or word decoder. Therefore each is an independent improvement suitable for implementation with other decoding techniques not yet known.

BRIEF DESCRIPTION OF THE DRAWINGS

FIG. 1 is a Trellis Diagram showing three survivor sequences and demonstrates the technique for determining the correlation metric values.

FIG. 2 is a block diagram of a method for implementation of the Modified Viterbi Decoder for soft decision output.

FIG. 3 is an overall block diagram for the Improved Multiple Decoder.

FIG. 4 is a block diagram for the Input Signal Processor used in the Improved Multiple Decoder.

FIG. 5 is a block diagram for the Pattern Recognition Decoder.

FIG. 6 is a block diagram for the Rank Sequential Decoder.

FIG. 7 is a block diagram for the Output Signal Processor used in the Improved Multiple Decoder.

DESCRIPTION OF THE INVENTION

The operation of a Viterbi type decoder is well known in the art, therefore, a detailed description is not necessary for a conventional Viterbi decoder. However, if information is desired reference is made to NASA TRR-396, "Simulation Results for the Viterbi Decoding Algorithm", available from the Science and Technical Information Office; National Aeronautics and Space Administration; Washington, D.C. 20546. This document also references many other publications. The description contained herein relates to basic concepts necessary to understand and implement the improvement required for concatenated soft decision use. The above referenced document also describes the method for convolutional encoding and codes suitable for the concatenated system described herein.

In a convolutional encoder, information bits are fed to a shift register. The signals representing the signal state (one or zero) from various stages of the encoder shift register are summed in a plurality of modulo-two adders. There may be two or three adders in typical convolutional encoders. The outputs of these adders are sampled and transmitted in sequence. When two symbols or channel bits are transmitted for each information bit, the code rate is ½ and if there are three symbols or channel bits per information bit, the rate is ⅓. For a concatenated system a ½ rate code is usually preferable but is not limited to this value.

It will be seen that the symbols or channel bits are determined by the coding inherent in the encoder design and the particular sequence of bits in the shift register. Considering a rate ½ decoder as an example, and with a particular sequence of bits stored in the shift register, the next two channel bits can be only one of two possible alternatives. One combination of channel bits will be produced if the next information bit is a logic one and the other combination of channel bits will be produced if the next information bit is a logic zero.

In a Viterbi decoder, there are $2^{N-1}$ branches where N is the number of stages in the encoder shift register. For this example, let K be the number of branches. Each branch represents a sequence of K information bits with all sequences represented from all logic zeros to all logic ones each having K bits. In decoding, the next two channel bits (in a rate ½ decoder) are compared to the channel bits produced if the next information bit is a logic one and also if the next information bit is a logic zero. The next information bit is chosen by the best correlation between the received channel bits and the bits produced by the two possible choices for the next information bit. This process is performed for each branch. Computations for each choice are defined as the State Metric Score. A choice is made as each new information bit is processed for each branch and establishes a sequence called a survivor sequence. The State Metric Scores for each branch are accumulated and are defined as the Branch Metric Sums. The sums are normalized so the best correlation is adjusted to a specific value.

Each branch contains a sequence of bits. The number of bits in a branch is defined as the search length. The decoder output is the oldest bit in the sequence which best correlates with the received sequence. This is a brief explanation of the operation of a conventional Viterbi Decoder.

For purpose of further explanation, a trellis diagram is shown in FIG. 1. Each State (1) in the decoding process is represented by a circle. The solid line is the Survivor Sequence (2) for the transmitted signal. If the Survivor Sequence (2) has the best correlation with the received signal sequence, then the signal from oldest bit in the sequence is the Output (3) and is the correct information bit. The Alternate Sequence (4) shown by the solid slashed line may be selected even though it is an incorrect sequence if it has the best correlation with the received signal. Although the incorrect sequence is selected, the correct Output (3) is obtained because the two sequences merge to the same oldest bit. Alternatively, Sequence (6) represented by the dashed line may have the best correlation with the received signal. In this case, the oldest bit of the sequence at Node (7) will be selected as the output. This bit has a 50% probability of being wrong.

When a Viterbi decoder produces single errors, then the wrong sequence is selected for only one bit period. When there is a burst of errors, the wrong sequence is selected for a period of time and during that period, each bit has a 50% probability of being wrong.

During the convolutional encoding process, each information bit effects the sequence of channel bits produced for the constraint length of the encoder and no more. In FIG. 1, the Vertical Dashed Line (8) is one constant length from the terminal end of the Sequence Storage Registers and Second Vertical Dashed line (9) is the terminal end. The section of the Sequence Storage Register between Vertical Dashed Line (8) and the Second Vertical Dashed Line (9) determines the probability of error of the output bit.

The State Metric Score and the accumlated Branch Metric Sum for each branch can be calculated for the segment betwen points (8) and (9) of the Sequence Storage Register. These sums are the Correlation Metric Values. It should be noted that this computation is similar but not identical to computation of the Branch Metric Sum. The State Metric Scores are computed such that the state metric bits which correlate with the received signal are weighted and added while the state metric bits which do not correlate are weighted and subtracted. The State Metric Scores are computed as described and added for each state transition at point (8) in the Sequence Storage Register and subtracted for each state transition at point (9) to obtain the Correlation Metric Values. The State Metric Score and Correlation Metric Values must not be normalized. The Correlation Metric Values are bounded but may be either positive or negative.

If the correct sequence is selected based upon the Branch Metric Sum, then the correlation for the last few bits in the stored sequence (one constraint length long) can be expected to have a high degree of correlation with the received signal. Conversely, if a wrong sequence is selected based upon the Branch Metric Sum, then the correlation of the last bits with the received signal should be low. Consequently, the coding gain of the system is reflected to the Correlation Metric Value used as the output quality signal.

To further explain the implementation of the Modified Viterbi Decoder reference is made to FIG. 2. The soft decision output is obtained from a Bit Synchronizer as in a conventional Viterbi decoder. These signals are fed through the Branch Metric Calculator (13) circuit to the Arithmetic Unit (11). The State Metric Scores are calculated and stored in the State Metric Storage (12). These sums are fed back to the Branch Metric Calculator (13) unit through the Arithmetic Unit (11). The Branch Metric Sums are normalized and an information bit decision is made and stored in the Path Memory (14). Based upon the best correlation determined from the Branch Metric Sums a decision is made using the Selector (15) and an output information bit is produced for each information bit transmitted. This operation is identical to a conventional viterbi decoder and is provided for completeness in the description but contains no improvement or modification.

In the Modified Viterbi Decoder, the novel features are related to the Correlation Metric (16) circuit. If FIG. 1 represents the Trellis Diagram for the Modified Viterbi Decoder of FIG. 2, then the State Metric Storage (12) of FIG. 2 is required to store the State Metric Scores for each State (1) in the Trellis Diagram, FIG. 1. A preferred implementation of the State Metric Storage (12) unit consists of sequential storage devies such as shift registers. As each new State Metric Score is computed it is entered into the Storage Metric Storage and scores in storage are shifted one step toward the output.

The Path Memory (14) of FIG. 2 is similar to the Path Memory of a conventional Viterbi Decoder. A detailed explaination is contained in the reference patent, Convolutional Decoder #3,789,360 by Clark, Jr., et al. FIG. 2 of the referenced patent contains switches which readily indicates the various survivor sequences or paths while FIG. 8 of the reference patent provides a digital logic implementation.

Since the Path Memory (14) of FIG. 2 identifies the path for each survivor sequence, it is possible to compute the Correlation Metric Value for each survivor sequence. This computation takes place in the Correlation Metric (16) circuit. It was shown in the referenced patent, Convolutional Decoder, that the Branch Metric Sum can be computed for each path by simply accumulating or summing the State Metric Scores for each branch. to compute the Correlation Metric Value in the Correlation Metric (16) circuit, it is necessary to add the State Metric Score for the state change across the boundary at line (8) of FIG. 1 and subtract the State Metric Score for the state change across line (9) of FIG. 1. Implementation of the summing process is the same as in a Convolution Decoder described in the referenced patent, Convolutional Decoder.

As stated previously, the Correlation Metric Value requires not only the addition of the State Metric Score across line (8) of FIG. 1, but subtraction of the State Metric Score across line (9) of FIG. 1. Implementation of a subtraction device in lieu of an adder offers no problem to one skilled in the art. It is necessary to identify which State Metric Score must be subtracted for each branch to compute the correct value. The Path memory (14) links the path between line (8) and line (9) of FIG. 1. Consequently, the State Metric Score for the state transition across line (9) is identified which is to be subtracted from the value being computed for each branch at the state transitions across line (9) of FIG. 1. Incidently, the computed Correlation Metric Value must be related to the terminal node or Output (3) in FIG. 1 rather than at the intermediate point at line (8).

Summarizing, in the Modified Viterbi Decoder, the novel features are related to the Correlation Metric (16) circuit. State Metric Scores are obtained from the State Metric Storage (12) and summed to produce the Correlation Metric Values. The state changes are preferably taken one constraint length prior to the end of the Path Memory. However, a slightly longer or shorter path length while not optimum will meet the intent of the invention. It is necessary to subtract the State Metric Scores for the last state transition in the sequence. A correlation Metric Value is only required for the output information bit. Consequently, when speed is not critical, microprocessors may be used for implementation instead of making computation for all Branches. When computations are made for each branch the selection of the required Correlation Metric Value is determined by the Selector (15). The essence of the modification consists of computation of the Correlation Metric Value using the algebraic sum of the State Metric Scores for all state transitions in a length approximately one constraint length long at the terminal end of the Path Memory.

One of the key factors in the improved Multiple Decoding System is the code. As with convolutional codes, there are almost an unlimited number of possibilities. It has been found that a code can be produced by a Boolean Algebra coefficient matrix of $8 \times 8$ elements. Each row determines the parity bit and each column represents an information bit. An optimum code is produced which has three zero coefficients in each row and each column with all other coefficients equal to one. The optimum code is produced when for each data value from 00000000 to 11111111 produces a set of all combinations of parity bits from all zeros to all ones. It will be found that the complement of the information bits will complement the parity bits. It will be noted that if the coefficients in the matrix are complemented, a code will be produced which will have similar properties to the code from which it was derived.

Another $8 \times 8$ matrix can be made which has four coefficients in each column and each row equal to zero and four coefficients in each column and each row equal to one. These coefficients can be arranged so that as the information bits are sequenced from 00000000 to 11111111, all combinations of the bits with an even number of zeros and an even number of ones are produced exactly twice. The complement of the information will not change the parity bits. This code has a Hamming distance of 5.

In order to obtain a higher improvement, it is possible to combine two $8 \times 8$ matrices to obtain one $16 \times 8$ matrix. Eight parity bits are generated from 16 information or data bits. One method is to combine the $8 \times 8$ matrix with 5 coefficients of unity in each row and column with the $8 \times 8$ matrix produced by complementing the coefficients. When this is done, there will be 8 unity coefficients in each row.

While the above code is excellent, a different code of equal or better performance can be produced. Take the above generated code and to each column with three coefficients of unity, change one of the zero coefficients to a one to produce a code as described for an $8 \times 8$ matrix with a Hamming distance of 5. The resulting matrix will have 9 coefficients equal to one for each row. The position of the added bit is not arbitrary and different codes can be produced by this technique. Some will perform better than the others.

While a detailed explanation is given for suitable codes for the Improved Multiple Decoding System, these can be related to the problems of selecting an optimum code for convolution encoders and decoders. Using the above described techniques, a code can be produced with an effective Hamming distance of over 5 although specific combinations will be as low as 4. However, the coding loss is only about 1.7 dB resulting in a greater net gain than a rate ½ code.

Although the codes have been described in eneral mathematical terms and specifies the required characteristics, it is generally found to be extremely difficult to find the matrices with the properties described. In order to demonstrate that these codes do exist, Table 1, Coefficient matrices, provide a typical example.

TABLE 1

| COEFFICIENTS MATRICES | | | | | | | | | | | | | | | | | | | | | | | |
|---|---|---|---|---|---|---|---|---|---|---|---|---|---|---|---|---|---|---|---|---|---|---|---|
| DATA BITS | | | | | | | | | | | | | | | | PARITY BITS | | | | | | | |
| 1 | 2 | 3 | 4 | 5 | 6 | 7 | 8 | 9 | 10 | 11 | 12 | 13 | 14 | 15 | 16 | 1 | 2 | 3 | 4 | 6 | 7 | 8 |
| 0 | 1 | 1 | 0 | 0 | 1 | 1 | 1 | 1 | 0 | 1 | 1 | 1 | 0 | 0 | 0 | 1 | 0 | 0 | 0 | 0 | 0 | 0 |
| 1 | 0 | 0 | 1 | 1 | 0 | 1 | 1 | 0 | 1 | 1 | 0 | 1 | 1 | 0 | 0 | 0 | 1 | 0 | 0 | 0 | 0 | 0 |
| 1 | 0 | 1 | 0 | 1 | 0 | 1 | 1 | 1 | 0 | 0 | 1 | 0 | 1 | 1 | 0 | 0 | 0 | 1 | 0 | 0 | 0 | 0 |
| 0 | 1 | 1 | 1 | 1 | 0 | 0 | 1 | 1 | 0 | 0 | 1 | 0 | 1 | 1 | 0 | 0 | 0 | 0 | 1 | 0 | 0 | 0 |
| 0 | 1 | 0 | 1 | 1 | 1 | 1 | 0 | 1 | 1 | 1 | 0 | 0 | 0 | 0 | 1 | 0 | 0 | 0 | 0 | 1 | 0 | 0 |
| 1 | 0 | 1 | 0 | 1 | 1 | 1 | 0 | 0 | 1 | 0 | 1 | 0 | 1 | 0 | 1 | 0 | 0 | 0 | 0 | 0 | 1 | 0 |
| 1 | 1 | 0 | 0 | 1 | 1 | 0 | 1 | 0 | 0 | 1 | 1 | 0 | 0 | 1 | 1 | 0 | 0 | 0 | 0 | 0 | 0 | 1 |
| 1 | 1 | 1 | 1 | 0 | 0 | 1 | 0 | 0 | 0 | 0 | 0 | 1 | 1 | 1 | 1 | 0 | 0 | 0 | 0 | 0 | 0 | 1 |

FIG. 3 is the overall Decoder Block Diagram for the Improved Multiple Decoding System. The Input Signal Processor (21) performs those functions which are common to Rank Sequential Decoding and Pattern Recognition Decoding. This includes serial to parallel conversion of data, digital-to-analog conversion, timing and similar functions. The Rank Sequential Decoder (22) is a decoder which processes the received channel bits sequentially based upon the probability of being correct and uses algebraic techniques to compute bits which have a high probability of error. Therefore, algebraic and statistical techniques are combined. The Pattern Recognition Decoder (23) is based upon recoding the received data bits to obtain new parity check bits. The received parity bits and parity check bits are compared to obtain an error pattern. This error pattern is processed using statistical methods to yield an output. The Output Signal Processor (24) compares the outputs of the two decoding processes to determine differences. Statistical techniques are again used to obtain a final output for the entire Multiple Decoder.

FIG. 4 is a more detailed diagram showing the functions of the Input Signal Processor. The Timer (41) receives a clock signal to sychronize the entire Multiple Decoder. This clock signal is fed to shift registers in various units and provides synchronizing signals within the Timer (41) also. The system is configured so that the Digital Data is fed to a Digital Data Shift Register (42). When a complete word to be decoded is in the Digital Data Shift Register (42) the entire coded word is transferred to a Digital Data Storage Register (43) where it is stored for one word period. The transfer pulse is obtained from the Timer (41). It is necessary to establish the beginning of a word. This is usually accomplished by a Frame Sync pulse from a Frame Synchronizer and fed to the Timer. Simular processing is done for the Quality Signal. There is a Quality Data Shift Register (44) and a Quality Data Storage Register (45).

FIG. 5 is a detailed block diagram of the Pattern Recognition Decoder. In this decoder, the parallel digital data is divided into the information or data bits and the parity bits. The information or data bits are sent to the Recoder (51) to generate parity check bits. These parity check bits are compared with the corresponding received parity bits in the Digital Comparator (52). An error pattern is produced if there is one or more bits received wrong. The error pattern is analyzed in the Error Analyzer (53) to determine subsets of possible received bit errors.

The digital signal quality signal is converted to analog voltages in the Digital to Analog Conversion circuit (54). The Analog Gates (55) are controlled by the Error Analyzer (53) which allows signals to pass to the Adders (56). Depending upon the error pattern and code, the number of signals from the adders may vary from approximately 5 to 16 in a typical design. The signal which is the minimum value is determined by the Analog Comparator (57). This sum has the least signal power and is produced by adding the signal power from a combination of bits which would produce the error pattern analyzed.

In the particular configuration shown, the channel with the smallest signal is selected by the 1 of 16 Selector (58). The particular bits which were added are identified using the output of the Error Analyzer (53). Identification of the specific bits which have the greatest probability of error is accomplished in the Corrector Generator (59). The actual correction is made by the Pattern Recognition Corrector (60). The output signal is the Pattern Recognition Decoder Data in parallel format.

It should be noted that the complete data word is processed simultaneously and not bit-by-bit. The decoded output is determined only by circuit delays and therefore can process data at exceptionally high rates. A gate signal may be required in some designed to clear the 1 of 16 Selector (58) prior to selecting the smallest signal and a control signal to make the selection. These are obtained from the Timer (41).

A detailed diagram for the Rank Sequential Decoder is shown in FIG. 6. Quality Signals are available from the Pattern Recognition Decoder in parallel format. These are fed to the Rank Comparitor (61). The Rank Comparitor (61) orders the bits in sequence from the one with the greatest signal magnitude first to the one with the minimum signal value last. At the start of each word, all data in the Sequential Decoder Register (65) is set to zero. The bit which has the largest signal magnitude is gated through the Data Gates (62) by the rank signal from the Rank Comparitor (61). The bit value is routed through the Inhibit Data Gates (63), through Switch Circuit (64) to the Sequential Decoder Register (65). If the bit value is a zero, there is no change, but if it is a one, the corresponding bit in the Sequential Decoder Register (65) is set to a one.

The ensemble of parity equations are stored in the Rank Parity Generator (66). As each bit is changed in the Sequential Decoder Register (65), the Rank Parity Generator (65) computes new parity values which are applied to Parity Gates (67). They are inhibited by the gates.

Each control signal applied to the Data Gates (62) is also fed through OR-Gates (68) to Matrix Equations (69). When there has been processed a sufficient number of bits to compute another bit of the coded word, a control signal from the Matrix Equations (69) allows the computed bit from the Rank Parity Generator (66) to pass through the Parity Gates (67) and through the Data OR-Gates (70) to the Switch Circuit (64). The signal is temporarily inhibited at the Switch Circuit (64).

The output of the Matrix Equations (69) is also fed through the Control OR-Gates (71) to the Inhibit Data Gates (63). The bit which can be determined by computations is inhibited at the Inhibit Data Gates (63) so that the computed value must be used. The output of the Control OR-Gate (71) is delayed by the Switch Delay (72). The purpose is to allow the circuit time to stablilize. After the circuits are stabilized, the control signal from the Switch Delay (72) allows the computed bit value to pass through the Switch Circuit (64) to the Sequential Decoder Register (65). Consequently bits of higher probability of error are inhibited and values computed from bits of higher probability of accuracy are used.

The control signal from the Control OR-Gate (71) is delayed in the Control Delay (73) and fed through the OR-Gates (68) to the Matrix Equations (69). The bits which have been computed are treated as received bits which have been processed. Consequently computed bits can be used to compute other bits which have a higher probability of error. The bits which have a high probability of accuracy are fed back in a regenerative fashion while bits of a high degree of probable error are inhibited. The regenerative characteristic allows the word to be decoded using a minimum number of bits with the greatest probability of accuracy. All processing takes place within a one word period and requires a minimum of arithmetic operation. The output of the Sequential Decoder Register (65) is the data in a parallel format.

FIG. 7 is a block diagram of the Output Signal Processor of the Improved Multiple Decoding System. The outputs of the Pattern Recognition Decoder and Rank Sequential Decoder are fed to the Bit by Bit Comparitor (81). If all bits agree, then the outputs of both Decoders are identical and either may be used as the Improved Multiple Decoder Output.

All bits which do not agree between the two words are fed to the Orthogonal Comparitor (82). The bits are divided into two groups. Those bits which were corrected in the Pattern Recognition Decoder are associated with Pattern Recognition Decoding while the remaining bits are associated with Rank Sequential Decoding. Analog quality signals are fed to the Orthogonal Comparitor (82) and a sum determined for the Pattern Recognition Decoder bits and for the Rank Sequential Decoder bits. Those bits which have the least power have the greatest probability of error while the group with the higher power has the greater probability of accuracy. The decoder output having the greater power as determined by the Orthogonal Comparitor (82) is selected.

The selected word is transferred to the Multiple Decoder Storage Register (83). The output from this register is Decoded Data in parallel format. When desired, the word can be converted to serial form using a Multiple Data Shift Register (84).

It should be noted that the Modified Viterbi Decoder can be used independent of other decoding processes if the signal quality signal is required for other purposes. It is possible to use the Modified Viterbi Decoder with the Pattern Recognition Decoder, the Rank Sequential Decoder or the Improved Multiple Decoder as a coneatenated system. It is also possible to use the Modified Veterbi Decoder with other types of soft decision decoders in the concatenated system. The Rank Sequential Decoder and Pattern Recognition Decoders may also be used independently of other decoders or in various combinations.

I claim:

1. A Modified Viterbi Decoder Process, said moficiations to a conventional Viterbi Decoder Process comprising the steps as follows:
   (a) algebraically adding the state metric scores for each state transition one constraint length prior to the output terminal of each branch in the search length path memory,
   (b) subtracting the state metric scores for each state transition at the output terminal of each branch in the search length path memory,
   (c) selecting the correlation metric value derived by said steps (a) and (b) above for the branch which is selected for the information bit output of said Modified Viterbi Decoder, and
   (d) providing said selected correlation metric values as the output soft decision quality signal for the said information bit.

2. An error correcting Pattern Recognition Decoder comprising the following steps:
   (a) converting received serial digital data to parallel digital data,
   (b) converting serial quality data to parallel quality data, said quality data being a measure of probable accuracy of the corresponding digital data,
   (c) recording the received information bits to generate parity check bits,
   (d) comparing said parity check bits generated with the received parity bits to produce an error pattern for analysis,
   (e) analysing the error pattern to determine a plurality of subsets, said subsets containing bits of questionable accuracy,
   (f) adding said quality data associated with each bit in each subset to produce a plurality of sums, each sum being associated with a subset of step (e) above,
   (g) comparing subsets to determine the subset with the smallest sum,
   (h) identifying the individual bits in the said subset with the smallest sum,
   (i) generating a correcting signal for each bit in said subset which has the smallest sum,
   (j) correcting the received digital data using said correcting signals,
   (k) providing corrected data as the Pattern Recognition Decoder output signal.

3. An error correcting Rank Sequential Decoder process comprising the following steps:
   (a) converting received serial digital data to parallel digital data,
   (b) converting serial quality data to parallel quality data, said quality data being a measure of probable accuracy of the corresponding digital data,
   (c) setting a digital data storage register to the all zero state,
   (d) setting the bit in said digital data storage register which corresponds to the received signal data bit with the highest probability of accuracy to the same state as said received signal data bit,
   (e) storing the bit number for the bit processed in step (d) above,
   (f) computing the parity for an ensemble of parity equations for the code used,
   (g) setting the bit in said digital data storage register which corresponds to the received signal data bit with the highest probability of accuracy not yet processed to the same state as said received signal data bit,
   (h) storing the bit number for the bit processed in step (g) above,
   (i) computing the parity for an ensemble of parity equations for the code used,
   (j) repeating steps (g), (h) and (i) above until a sufficient number of bits have been processed to compute the data state for a bit not processed,
   (k) determine the bit number of the bit which can be computed from data processed,
   (l) inhibit the received data bit which can be computed from data processed,
   (m) set the computed data bit in said digital data register to the computed state,
   (n) store the computed data bit number as a processed bit,
   (o) using the computed data bit number, determine if other data bits can be computed,
   (p) if other data bits can be determined from processed data, repeat steps (k) through (p), (q) repeat steps (g) through (p) until all bits have been processed using either received data or computed data, (r) providing corrected data as the Rank Sequential Decoder output signal.

4. An Improved Multiple Decoding System process comprised of the following steps:
(a) all steps described in claim 3,
(b) recording the received information bits to generate parity check bits,
(c) comparing said parity check bits generated with the received parity bits to produce an error pattern for analysis,
(d) analysing the error pattern to determine a plurality of subsets, said subsets containing bits of questionable accuracy,
(e) adding said quality data associated with each bit in each subset to produce a plurality of sums, each sum being associated with a subset of step (d) above,
(f) comparing subsets to determine the subset with the smallest sum,
(g) identifying the individual bits in the said subset with the smallest sum,
(h) generating a correcting signal for each bit in said subset which has the smallest sum,
(i) correcting the received data using said correcting signals,
(j) provided corrected data as the Pattern Recognition Decoder output signal,
(k) comparing the outputs of said Rank Sequential Decoder with the outputs of said Pattern Recognition Decoder bit by bit to determine a set of bits which are not the same for both said decoders,
(l) dividing the set of bits into two subsets, one subset being associated with said Rank Sequential Decoder and the other with said Pattern Recognition Decoder,
(m) adding the quality data for each bit of each said subset to obtain two sums,
(n) determining the sum which has the greater value,
(o) selecting the decoded word which has the greatest power for the Improved Multiple Decoder output,
(p) providing the selected word as the Improved Multiple Decoder output.

5. A concatenated Decoder process consisting of a Modified Viterbi Decoder process and a Pattern Recognition Decoder process comprising the following steps:
(a) all steps in claim 1,
(b) all steps in claim 2 wherein the output of said Modified Viterbi Decoder is the input to said Pattern Recognition Decoder.

6. A Concatenated Decoder process consisting of a Modified Viterbi Decoder process and a Rank Sequential Decoder process comprising the following steps,
(a) all steps in claim 1,
(b) all steps in claim 3 wherein the output of said Modified Viterbi Decoder is the input to said Rank Sequential Decoder.

7. A Concatenated Decoder process consisting of a Modified Viterbi Decoder process and an Improved Multiple Decoder process comprising the following steps:
(a) all steps in claim 1
(b) all steps in claim 4 wherein the output of said Modified Viterbi Decoder is the input to said Improved Multiple Decoder.

8. A process for encoding digital data for use in error correcting systems comprising the following steps:
(a) formatting sixteen information or data bits into digital words for encoding,
(b) encoding the said sixteen data bits with eight parity bits to form twenty-four bit code words,
(c) generating the eight parity bits using a $16 \times 18$ coefficient matrix which consists of a combination of two $8 \times 8$ matrices have the following characteristics;
  (1) one of said $8 \times 8$ matrices has 5 unity coefficients for a subset of 8 data bits and generate all combinations of parity bits once and only once as the data is sequenced from all zeros to all ones, and
  (2) the other said $8 \times 8$ matrix has 4 unity coefficients for a subset of 8 data bits and generates all even combinations of parity bits which have an even number of ones and an even number of zeros, including all ones and all zeros, twice when the data is sequenced from all zeros to all ones;
(d combining the results from said two $8 \times 8$ matrices to produce said 8 parity bits in said code word.

* * * * *